(12) United States Patent
Guettaf

(10) Patent No.: US 6,968,519 B2
(45) Date of Patent: Nov. 22, 2005

(54) SYSTEM AND METHOD FOR USING IDDQ PATTERN GENERATION FOR BURN-IN TESTS

(75) Inventor: Amar Guettaf, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 291 days.

(21) Appl. No.: 10/329,789

(22) Filed: Dec. 26, 2002

(65) Prior Publication Data

US 2004/0153932 A1 Aug. 5, 2004

(51) Int. Cl.⁷ .......................................... G06F 17/50
(52) U.S. Cl. .................. 716/4; 716/2; 716/5
(58) Field of Search ........................ 716/4, 5

(56) References Cited

U.S. PATENT DOCUMENTS

| | | | |
|---|---|---|---|
| 5,519,333 A * | 5/1996 | Righter | 324/765 |
| 6,285,212 B1 * | 9/2001 | Kaptanoglu | 326/41 |
| 6,714,032 B1 * | 3/2004 | Reynick | 324/765 |
| 6,756,804 B2 * | 6/2004 | Ishibashi | 324/765 |
| 2004/0025123 A1 * | 2/2004 | Angilivelil | 716/4 |
| 2004/0098687 A1 * | 5/2004 | Guettaf et al. | 716/7 |

OTHER PUBLICATIONS

Provisional U.S. Appl. No. 60/400,425.*
Henry, T.R. et al., Burn-in Elimination of a High Volume Microprocessor Using IDDQ, Proceedings of the International Test Conference, pp. 242-249, Oct. 1996.*
M.R. Patel et al., IDDQ Test Methodology and Tradeoffs for Scan/Non-Scan Designs, Proceedings of the Seventh Asian Test Symposium, pp. 138-143, Dec. 1998.*

* cited by examiner

*Primary Examiner*—A. M. Thompson
(74) *Attorney, Agent, or Firm*—McAndrews, Held & Malloy, Ltd.

(57) ABSTRACT

A method and system are disclosed for efficiently and effectively toggling logic states of chip elements during a burn-in process of a digital integrated circuit chip. A set of IDDQ patterns are generated by a design simulation tool, based on the design of the chip, during a simulation of the design. The set of IDDQ patterns are translated to a set of burn-in patterns that are compatible with a pattern format of a burn-in board using a pattern translation tool. The set of burn-in patterns are stored in memory on the burn-in board and shifted into the memory during the burn-in process to aid in toggling logic states of the chip elements.

16 Claims, 3 Drawing Sheets

SYSTEM AND METHOD FOR USING IDDQ PATTERN GENERATION FOR BURN-IN TESTS

RELATED APPLICATIONS

U.S. application Ser. No. 10/299,187 filed on Nov. 19, 2002 is incorporated herein by reference in its entirety. U.S. application Ser. No. 10/299,257 filed on Nov. 19, 2002 is incorporated herein by reference in its entirety.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Digital integrated circuit chips are composed of many millions of gates that make up various functional components on a chip such as flip-flops, multiplexers, logic circuits, etc. A given chip design may have thousands of flip-flops scattered throughout the chip.

In order to effectively and efficiently test a given chip, certain test features are typically incorporated into the chip design for testing purposes. Before a chip is actually taped out and manufactured, the chip design is first simulated in software using various simulation tools such as, for example, a Verilog Test Bench. By simulating the design of the chip, the design features of the chip may be thoroughly tested before the expense and time of actually manufacturing the chip is incurred.

Pattern verification is a critical phase in testing of chips. A scan pattern is a digital string of binary ones and zeros that may be shifted through a scan chain of flip-flops in the chip design. Every scan pattern cycle is composed of two phases. The first phase is the shift phase where new data is shifted into the scan chains of flip-flops. The second phase is the capture phase where the data is captured by the various chip components by applying a clock pulse.

Typically, the flip-flops in a digital integrated circuit design are designed such that they have normal data inputs and outputs (D and Q) and test inputs such as TI (test data input) and TE (test enable input). During simulation and testing, the flip-flops may be placed in the test mode by enabling the TE input. Data may then be clocked into the flip-flops through the TI input instead of the normal D data input. During testing, the flip-flops of the chip are chained together to form multiple scan chains. The output Q of a given flip-flop is connected to the input TI of a next flip-flop. Each scan chain may comprise, typically, 5000 to 10,000 flip-flops.

One way of checking for defects in elements of CMOS chips is to perform IDDQ testing. IDDQ is the quiescent drain-drain current of a CMOS element in a chip. During a standby or quiescent state of the chip, the logic states of the elements of the chip are stable. No activity is being performed by the chip. A CMOS circuit uses very little power and, in a standby or quiescent state, draws almost no current. Only leakage current is drawn in the standby or quiescent state. However, if the current consumption observed in the standby state is higher than expected, then a defect of some type is probably present in the chip.

IDDQ testing, therefore, measures the quiescent supply current of the device under test. A CMOS circuit should not draw a significant amount of current when in a stable situation. In the quiescent state, only leakage current will flow. A larger, unexpected amount of current that is observed flowing in the quiescent state indicates that a manufacturing or design defect is likely present in the circuit.

FIG. 1 illustrates an embedded CMOS inverter comprising a PMOS transistor and an NMOS transistor. When $V_{in}$ transitions (toggles) from a logic zero to a logic one, $V_{out}$ toggles from a logic one to a logic zero. When $V_{in}$ transitions from a logic one to a logic zero, $V_{out}$ transitions from a logic zero to a logic one. As a result, $I_{DD}$ current is drawn by the inverter during the transition times, flowing from $V_{DD}$ to $V_{SS}$.

When $V_{in}$ and $V_{out}$ are not toggling, the current drawn by the inverter is $I_{DDQ}$, the quiescent current, as shown in FIG. 1. If the inverter has no defects, $I_{DDQ}$ is very low compared to the $I_{DD}$ transition current. However, if the inverter is defective (e.g., a short across one of the transistors), then $I_{DDQ}$ is relatively high, indicating a defect.

During simulation of the design of an integrated circuit chip, IDDQ patterns may be generated based on the design of the chip. The IDDQ patterns are designed to toggle the logic states of as many of the elements of the chip as possible in order to subsequently test the chip for defects using the IDDQ patterns and measuring the currents.

A burn-in process or test is a method used, in general, to test how a chip ages. A burn-in process is typically used to stress chips to try to induce faults in the chips. The purpose is to test the robustness of the chips and to eliminate "infant mortalities" of the chips (i.e., weed out chips that are likely to fail relatively quickly). During the burn-in process, the chips are stressed over temperature and supply voltage for a certain period of time. It is desireable, during the burn-in process, to put the chips in a dynamic operational state (i.e., toggle as many of the logic components of the chip as possible). Once the burn-in process (or a stage of the burn-in process) is complete, the chips are functionally tested to check for defects.

During the burn-in process, the chips are mounted on burn-in boards. The burn-in boards are typically circuit boards that allow the chips to be powered up and dynamically activated or exercised. The burn-in boards typically comprise memory and/or clock circuitry to exercise the chips. The burn-in boards may interface to power supplies and other test equipment in order to apply power to the chips and to exercise the elements of the chips.

During burn-in, the chips are exercised by clocking burn-in data patterns into the chips. However, the burn-in boards typically have a limited amount of memory to store the burn-in patterns and, therefore, the burn-in patterns used are often not capable of exercising a very large percentage of the chip (i.e., providing a high percentage of toggle coverage) as desired. The burn-in patterns are typically applied to the chips continuously for tens of hours.

Most of the time, the burn-in patterns used are chosen from either functional patterns that usually target a very limited area of the chip. Scan patterns are sometimes used and may provide better toggle coverage but the choice of scan patterns can be tricky because the total number of scan patterns is usually orders of magnitude larger than what may be loaded on the memory of the burn-in boards.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A method is provided to efficiently and effectively toggle a large percentage of chip elements during a burn-in process for a digital integrated circuit chip. IDDQ patterns are generated, based on the design of the chip, during a simulation of the design. The IDDQ patterns are translated to burn-in patterns that are compatible with a pattern format of a burn-in board. The burn-in patterns are stored in memory on the burn-in board and shifted into balanced global scan chains during the burn-in process to aid in toggling logic states of the chip elements.

A system is provided to generate burn-in patterns used to toggle elements of a digital integrated circuit chip during a burn-in process. The system includes a set of chip design definition files comprising a plurality of nets defining elements of the chip. A design simulation tool of the system is used to generate a set of IDDQ patterns based on the set of chip design definition files. A pattern translation tool of the system is used to translate the set of IDDQ patterns to a set of burn-in patterns.

These and other advantages and novel features of the present invention, as well as details of an illustrated embodiment thereof, will be more fully understood from the following description and drawings.

DETAILED DESCRIPTION OF THE INVENTION

Aspects of the present invention provide a system and method to efficiently and effectively toggle a high percentage of chip elements during a burn-in process for a digital integrated circuit chip.

Figure 1:
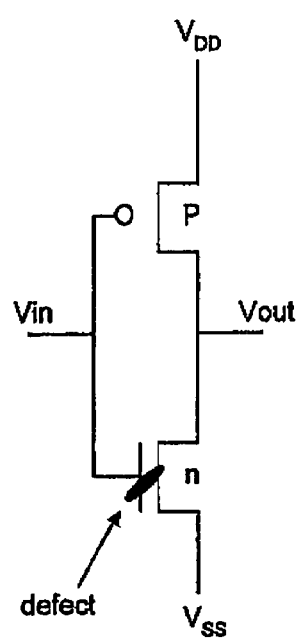
FIG. 1 is a schematic diagram of an exemplary embedded inverter in a digital integrated circuit chip and associated voltage and IDDQ timing diagrams.
Figure 1:
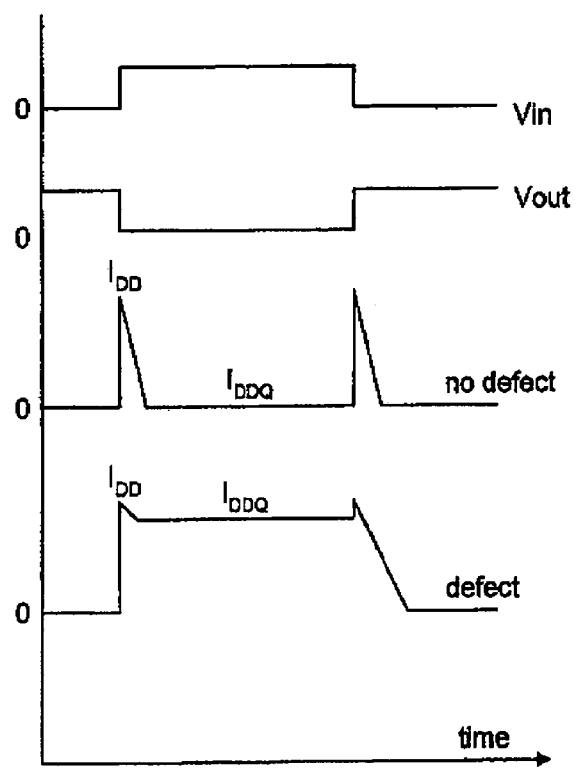
Figure 2:
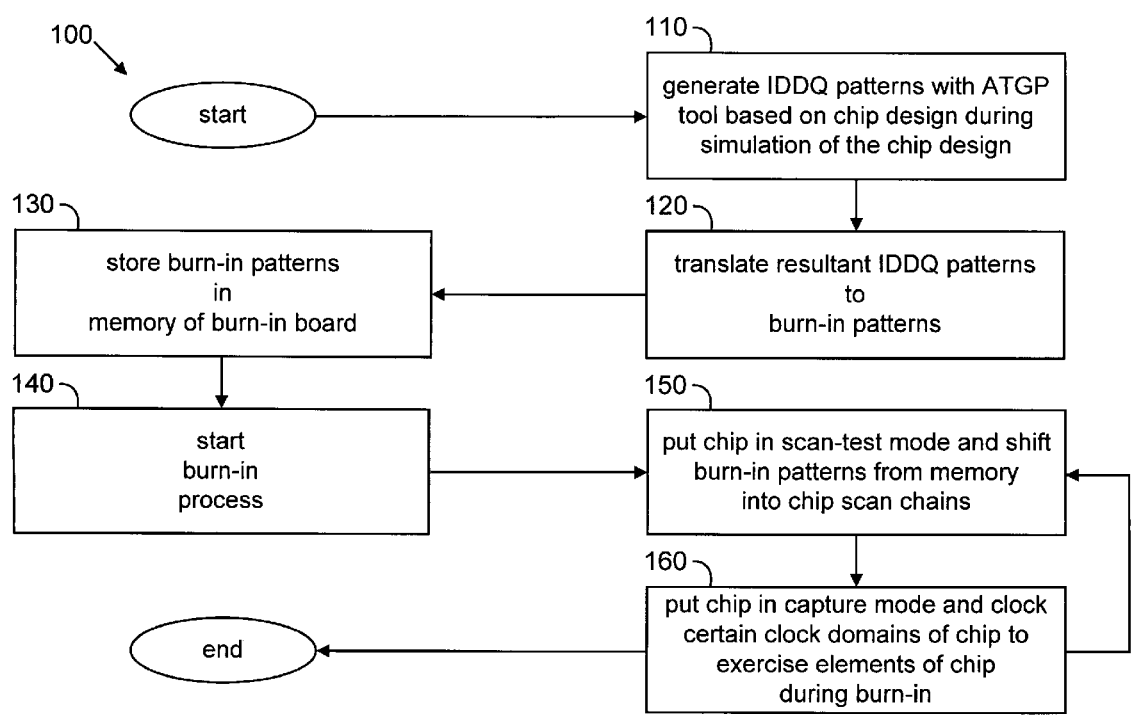
FIG. 2 is a flowchart of a method to generate a set of burn-in patterns from a set of IDDQ patterns and to use the resultant burn-in patterns for toggling elements of a digital integrated circuit chip during a burn-in process, in accordance with an embodiment of the present invention.
Figure 3:
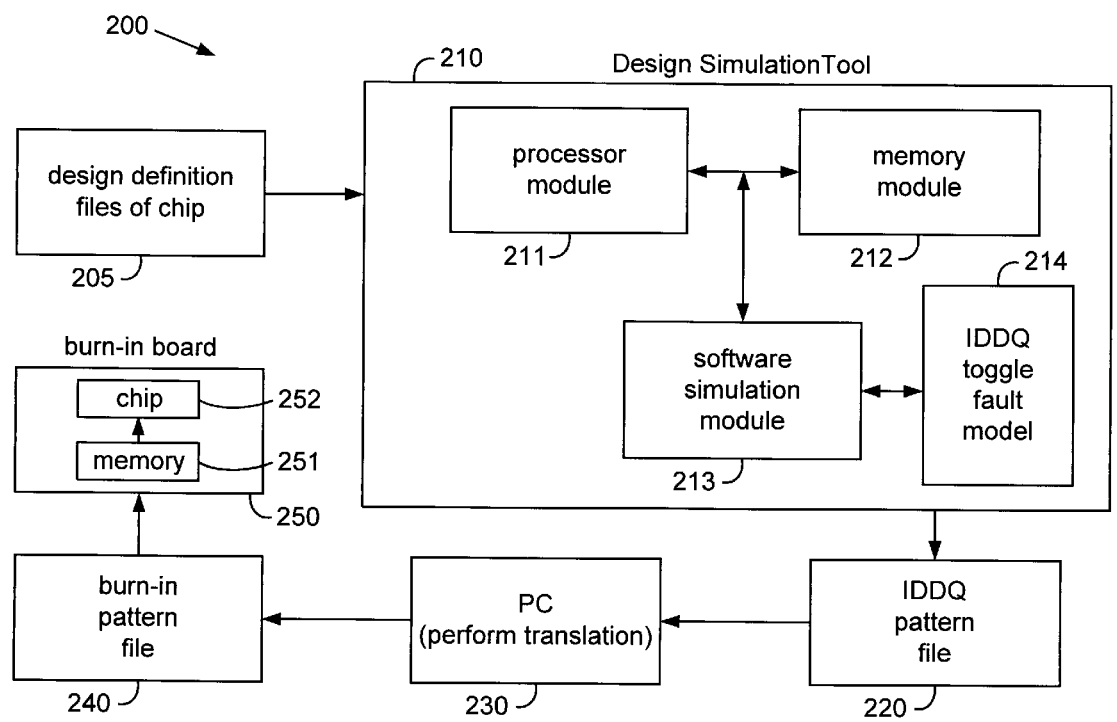
FIG. 3 is a schematic block diagram of a system to implement the method of FIG. 2 in accordance with an embodiment of the present invention.

Referring to FIG. 2 and FIG. 3, in accordance with an embodiment of the present invention, a method 100 is performed using a system 200 to generate a set of burn-in patterns 240 that may be loaded into a memory 251 of a burn-in board 250. The resultant burn-in patterns are generated in such a way as to fit efficiently into a limited memory 251 of a burn-in board 250 and to toggle a large percentage of the elements of at least one digital integrated circuit chip 252 mounted on the burn-in board 250 when shifted into global scan chains of the chip 252.

In an embodiment of the present invention, a design simulation tool 210 is used to read a set of design definition files 205 that completely define the design of the chip 252, including the nets (elements) of the chip 252. The elements (nets) of the chip may comprise flip-flops, logic gates, transistors, multiplexers, and other digital elements.

In an embodiment of the present invention, the design simulation tool 210 comprises a processor module 211, a memory module 212, and a software simulation module 213 residing in the memory module 212 and executed by the processor module 211. The design simulation tool 210 also includes an IDDQ toggle fault model 214 residing in the memory module 212 and executed by the processor module 211 in conjunction with the software simulation module 213 to generate a set of IDDQ data patterns 220. In an embodiment of the present invention, the design simulation tool 210 comprises an automatic test pattern generation (ATPG) tool such as the Tetramax tool from Synopsis or the Fast Scan tool from Mentor Graphics.

In step 110 of method 100, the set of IDDQ patterns 220 are generated, having a first data format, using the IDDQ fault model 214 in the ATGP design simulation tool 210. The IDDQ patterns are generated in a deterministic manner based on the design of the chip 252 in order to maximize the percentage of the chip 252 that may be exercised by the IDDQ patterns 220. The number of IDDQ patterns to effectively exercise the elements of the chip 252 is relatively small. In accordance with an embodiment of the present invention, the number of IDDQ patterns may match a number of global scan chains of flip-flops in the design of the chip 252. The IDDQ patterns 220 may be saved in the form of a computer file.

In step 120, the IDDQ patterns are translated to a set of burn-in patterns 240, having a second data format, by a personal computer (PC) 230, in accordance with an embodiment of the present invention. The PC 230 uses a software program to convert from the first data format to the second data format and may save the set of burn-in patterns 240 as a computer file.

In step 130, the burn-in patterns are loaded and stored into the memory 251 on the burn-in board 250. In accordance with an embodiment of the present invention, the PC 230 may interface to the burn-in board 251 in order to download the burn-in patterns 240.

In step 140, the burn-in process is started. The burn-in board 250 may be placed in a temperature chamber and interfaced to power supplies and other equipment to facilitate the burn-in process. During the burn-in process, the chip 252 on the burn-in board 250 is put into a scan test mode, in step 150, where the burn-in patterns are shifted into global scan chains of the chip 252 from the memory 251 in accordance with an embodiment of the present invention.

In accordance with an embodiment of the present invention, the design of the chip 252 incorporates global scan chains that are balanced with respect to number of flip-flops per global scan chain (see U.S. application Ser. No. 10/299, 187 filed on Nov. 19, 2002 which is incorporated herein by reference in its entirety).

It is not necessary that each global scan chain be exactly balanced with every other global scan chain. In other words, each global scan chain does not need to have the exact same number of flip-flops. In an embodiment of the present invention, the global scan chains are balanced such that each global scan chain contains substantially the same number of flip-flops. For example, all of the global scan chains may be within 10 flip-flops of each other.

As an example, n channels of burn-in patterns may be shifted into memory 251 in step 130 in accordance with an embodiment of the present invention. Each of the n channels of burn-in pattern data may be clocked through n global scan chains of the chip 252. Each global scan chain may be clocked using a different clock provided by the burn-in board 250 or by external interfacing equipment, in accordance with embodiments of the present invention.

Since the global scan chains of the chip design 252 are balanced, the testing of the chip is very efficient. The length of the shift phase of the global scan chains is about the same for all global scan chains. Also, the amount of memory 251, on the burn-in board 250, is minimized by the global scan chains being balanced.

Once the flip-flops of the global scan chains are in a certain state (i.e., loaded with a certain deterministic burn-in pattern), the chip 252 may be put into a capture mode in step 160. In the capture mode, the output logic states of the flip-flops of the global scan chains are stable according to the last shifted states of the burn-in patterns. In the caputure mode, the various clock domains of the chip 252 may be clocked to toggle the logic states of the various elements of the chip 252 in order to exercise the vast majority of the elements of the chip 252 during the burn-in process.

In accordance with an embodiment of the present invention, during the burn-in process, the chip 252 is switched back and forth between the scan-test mode (shifting through the flip-flops of the global scan chains, step 150) and the capture mode (toggling the elements of the chip, step 160) in order to continuously toggle the logic states of the elements of the chip 252. The balanced global scan chains in combination with the burn-in patterns 240 (that are based on IDDQ patterns 220 for the design of the chip 252) ensure that the vast majority of the elements of the chip are continuously exercised (toggled) during the number of hours of the burn-in process.

The various modules and elements of the system 200 may be combined or separated according to various embodiments of the present invention and may comprise various combinations of software and hardware modules and elements according to various embodiments of the present invention. For example, in an embodiment of the present invention, the design simulation tool 210 may incorporate the translation tool 230 and interface directly with the burn-in board 250 to download burn-in patterns to the memory 251 of the burn-in board 250.

In summary, aspects of the present invention provide for efficiently and effectively toggling a large percentage of chip elements during a burn-in process for a digital integrated circuit chip using burn-in patterns derived from IDDQ patterns that are shifted into balanced global scan chains of the chip during the burn-in process. Even though the burn-in patterns are based on IDDQ patterns, which are used for finding defects in CMOS chips, embodiments of the present invention are not restricted to CMOS chips.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A method to efficiently and effectively toggle a large percentage of chip elements during a burn-in process for a digital integrated circuit chip, said method comprising:

generating a set of IDDQ patterns, based on a design of said chip, during a simulation of said design;

translating said set of IDDQ patterns to a set of burn-in patterns such that said set of burn-in patterns are compatible with a pattern format of a burn-in board;

storing said set of burn-in patterns in a memory of said burn-in board wherein said burn-in board comprises at least said memory and said chip, and is used in said burn-in process; and shifting said set of burn-in patterns into said chip from said memory on said burn-in board during said burn-in process.

2. The method of claim 1 wherein said shifting is performed in a scan-test mode of said chip.

3. The method of claim 1 wherein said shifting is through scan chains of flip-flops of said chip.

4. The method of claim 3 wherein said scan chains of flip-flops comprise global scan chains that are balanced with respect to a number of flip-flops per global scan chain.

5. The method of claim 1 further comprising periodically interrupting said shifting to place said chip in a capture mode and clocking at least one clack domain of said chip to toggle logic states of said chip elements during said burn-in process.

6. The method of claim 1 wherein said set of IDDQ patterns are generated in a deterministic manner.

7. The method of claim 1 wherein said set of IDDQ patterns are generated using an IDDQ toggle fault model within said simulation.

8. The method of claim 1 wherein said chip elements comprise at least flip-flops, logic gates, multiplexers, memory circuits, and registers.

9. A system, used in simulation and testing of a design of a digital integrated circuit chip, to generate a set of burn-in patterns used to toggle elements of said chip during a burn-in process, said system comprising:

a set of chip design definition files comprising a plurality of nets defining said elements of said chip;

a design simulation tool to generate a set of IDDQ patterns in response to said set of chip design definition files;

a pattern translation tool to translate said set of IDDQ patterns to said set of burn-in patterns; and at least one burn-in board wherein said set of burn-in patterns are loaded into a burn-in memory on said at least one burn-in board from said pattern translation tool.

10. The system of claim 9 wherein said design simulation tool comprises:

at least one processor module;

at least one memory module;

at least one software simulation module residing in said at least one memory module and executed by said at least one processor module; and an IDDQ toggle fault model residing in said at least one memory module and executed by said at least one processor module in conjunction with said at least one software simulation module to generate said set of IDDQ patterns.

11. The system of claim 9 wherein said set of burn-in patterns are in a format compatible with said burn-in board.

12. The system of claim 9 wherein said pattern translation tool comprises a personal computer external to said design simulation tool.

13. The system of claim 9 wherein said pattern translation tool is an internally integrated part of said design simulation tool.

14. The system of claim 9 wherein said set of chip design definition files comprises a number of balanced global scan chains.

15. The system of claim 9 wherein said design simulation tool comprises an Automatic Test Pattern Generation (ATPG) tool.

16. The system of claim 9 wherein said at least one burn-in board includes at least one of said chip during said burn-in process.

* * * * *